(12) United States Patent
Lin et al.

(10) Patent No.: US 7,745,737 B2
(45) Date of Patent: Jun. 29, 2010

(54) PRINTED CIRCUIT BOARD HAVING VIAS

(75) Inventors: Yu-Hsu Lin, San Jose, CA (US);
Shang-Tsang Yeh, Tu-cheng (TW);
Chao-Chen Huang, Tu-cheng (TW);
Chuan-Bing Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 945 days.

(21) Appl. No.: 11/478,922

(22) Filed: Jun. 30, 2006

(65) Prior Publication Data
US 2007/0000691 A1     Jan. 4, 2007

(30) Foreign Application Priority Data
Jul. 2, 2005     (CN) .................. 2005 1 0035782

(51) Int. Cl.
*H01R 12/04*     (2006.01)
*H05K 1/11*     (2006.01)
*H01K 3/22*     (2006.01)

(52) U.S. Cl. .................. 174/262; 361/792; 29/852

(58) Field of Classification Search ......... 174/262–266; 361/792–795; 29/852
See application file for complete search history.

(56) References Cited

U.S. PATENT DOCUMENTS

| 6,076,726 | A  | * | 6/2000 | Hoffmeyer et al. ...... 228/180.22 |
| 6,388,206 | B2 |   | 5/2002 | Dove et al. |
| 7,155,821 | B1 | * | 1/2007 | Downes et al. ............ 29/852 |
| 2003/0178229 | A1 | * | 9/2003 | Toyoda et al. ............ 174/261 |

FOREIGN PATENT DOCUMENTS

| CN | 03267943.2 | 8/2004 |
| JP | 2003-273525 A | 9/2003 |

* cited by examiner

*Primary Examiner*—Jeremy C Norris
(74) *Attorney, Agent, or Firm*—Zhigang Ma

(57) ABSTRACT

A printed circuit board (PCB) having vias for reducing reflections of input signals includes a first signal layer, a second signal layer, one via, an input signal line arranged on the first signal layer, and an output signal line arranged on the second signal layer. The via further includes a drill hole, a first pad, and a second pad. The first pad is electrically connected with the input signal line, and the second pad is electrically connected with the output signal line. An outer diameter of the first pad is smaller than an outer diameter of the second pad.

11 Claims, 4 Drawing Sheets

US 7,745,737 B2

PRINTED CIRCUIT BOARD HAVING VIAS

BACKGROUND

1. Field of the Invention

The present invention relates to a printed circuit board (PCB), and more particularly to a PCB having vias for reducing reflections of input signals.

2. General Background

In modern communications, transmission speed of signals has become quicker and quicker. Signal integrity refers to fidelity of signal curves. However, qualities of signals are often reduced because of signal reflection that is caused by discontinuity of impedance in transmission lines of the PCB.

More signal transmission layers are needed because of the increasing density of signal lines. So it is inevitable that the signal transmissions between different layers of a PCB should be achieved through conductive vias. Design of the conductive vias is crucial in the design of multilayer PCBs. The vias can be divided into three types according to their usage and process of manufacture. They are blind vias, buried vias, and through vias. The blind vias are usually located on a surface of the top layer or bottom layer of the PCB to connect signals between surface layers and inner layers. The buried vias are located in the inner layers, and the through vias penetrate through all the layers of the PCB to complete electrical connections among all the layers. When a connection between the vias and transmission lines is necessary, discontinuity of impendence of transmission lines affects the integrity of the signals.

Referring to FIG. 1, a conventional via of a PCB comprises a drill hole 11, a pad 13, and an anti-pad 15. The drill hole 11 is a through hole. The pad 13 is located at opposite signal layers. So there are two same pads 13. The anti-pad 15 is located at non-connective layers. Referring to FIG. 2, a circuit parameter module of a via comprises two capacitances $C_0$, $C_1$ and an inductance L. The magnitude of the capacitance $C_0$ or $C_1$ is affected by sizes of the pad and the anti-pad. The approximate capacitance of each pad 13 is determined according to the following formula:

$$C = \frac{1.41 \varepsilon_r D_1 T}{D_2 - D_1}$$

Wherein $\varepsilon_r$ is the dielectric constant of the PCB, T is the thickness of the PCB layers to which the via is connected, $D_1$ is the diameter of the pad, $D_2$ is the diameter of the anti-pad. Referring to FIG. 1, in the prior art, $D_{10}=D_{12}$. Effects of an equivalent capacitance are greater than that of the inductance, therefore, the impedance of the whole via is counted as follows:

$$C_{via1} = C_{10} + C_{12} = 2 \times C_{10} = 2 \times \frac{1.41 \varepsilon_r D_{10} T}{D_{20} - D_{10}}$$

In the designing process, the size of the via is designed to be smaller to reduce the stray capacitance of the via.

Commonly in the design process, diameters of the pad and the anti-pad of the via are reduced simultaneously. Thereby, the reflection of the input signals is reduced because of a reduction in a capacitance of the corresponding pad. However, the diameter of the pad connected with the output signals is reduced as well, which results in a reduction in reflection of the output signals, therefore, the error of the output signals is larger which affects the signal integrity of the output signals. When the signals are transmitted, the capacitance of the pad connected with the input signal lines is large, so the impedance of the pad is small nearly to the point of being a short circuit, however, the signal lines have a certain impedance. Therefore, the impedance of the transmission lines are discontinuous, and large reflections are caused.

What is needed, therefore, is a PCB having vias designed for reducing the reflections of input signals.

SUMMARY

An exemplary printed circuit board (PCB) having vias reducing reflections of input signals includes a first signal layer, a second signal layer, one via, an input signal line arranged on the first signal layer, and an output signal line arranged on the second signal layer. The via includes a drill hole, a first pad, and a second pad. The first pad is electrically connected with the input signal line, and the second pad is electrically connected with the output signal line. An outer diameter of the first pad is smaller than an outer diameter of the second pad.

Other advantages and novel features will become more apparent from the following detailed description when taken in conjunction with the accompanying drawings, in which:

DETAILED DESCRIPTION OF THE EMBODIMENTS

Figure 3:
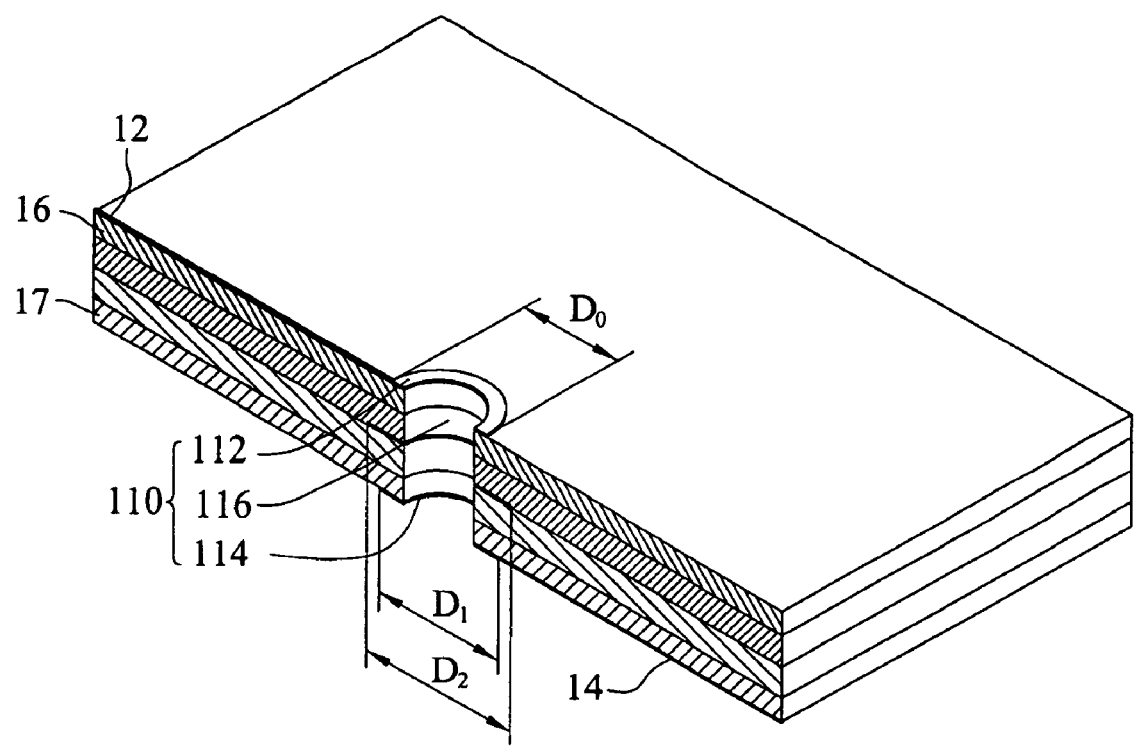
FIG. 3 is a cross section of part of a PCB having a via in accordance with a preferred embodiment of the present invention.

Referring to FIG. 3, a circuit assembly like a PCB having vias in accordance with a preferred embodiment of the present invention includes a first signal layer 16, a second signal layer 17, a via 110, an input signal line 12, and an output signal line 14. The via 110 includes a drill hole 116, a first pad 112 connected to the first signal layer 16 and encircling an end of the drill hole 116 is electrically connected with the input signal line 12, and a second pad 114 connected to the second layer 17 and encircling an other end of the drill hole 116 is electrically connected with the output signal line 14. In the preferred embodiment of the invention, an outer diameter $D_0$ of the first pad 112 is smaller than an outer diameter $D_1$ of the second pad 114, that is, $D_0<D_1$. Therefore, an extending length of the first pad 112 away from the drill hole 116 is smaller than an extending length of the second pad 114 away from the drill hole 116. Compared with the conventional technology, the outer diameter of both anti-pads is equal, that is, $D_2=D_{20}$. Also, the outer diameter $D_1$ of the second pad 114 is unaltered compared with the pad 13 of the conventional PCB, that is, $D_1=D_{12}$. Therefore, capacitance of the via in the preferred embodiment of the invention is determined as follows:

$$C_{via} = C_0 + C_1 = \frac{1.41\varepsilon_r D_0 T}{D_2 - D_0} + \frac{1.41\varepsilon_r D_1 T}{D_2 - D1}$$

wherein $C_0$ is the capacitance of the first pad 112, $C_1$ is the capacitance of the second pad 114. The capacitance of pads is directly proportional to the diameter of the pads, therefore, the capacitance $C_0$ of the first pad 112 is reduced because of reducing the outer diameter $D_0$. Therefore capacitance $C_1$ of the second pad 114 is greater than the capacitance $C_0$. Thus, the overall capacitance of the via $C_{via}$ of the preferred embodiment of the invention is less than the capacitance $C_{via\,1}$ of the conventional via. The impedance of the via is inversely proportional to the capacitance of the via. Therefore, the impedance of the via 110 is increased. The impedance of the via is more closely matched with the impedance of the input signal transmission line, and the reflection of the input signal line is reduced. Therefore, the expected effect of reducing reflection of the input signal without reducing reflection of the output signal of the present invention is achieved.

Figure 1:
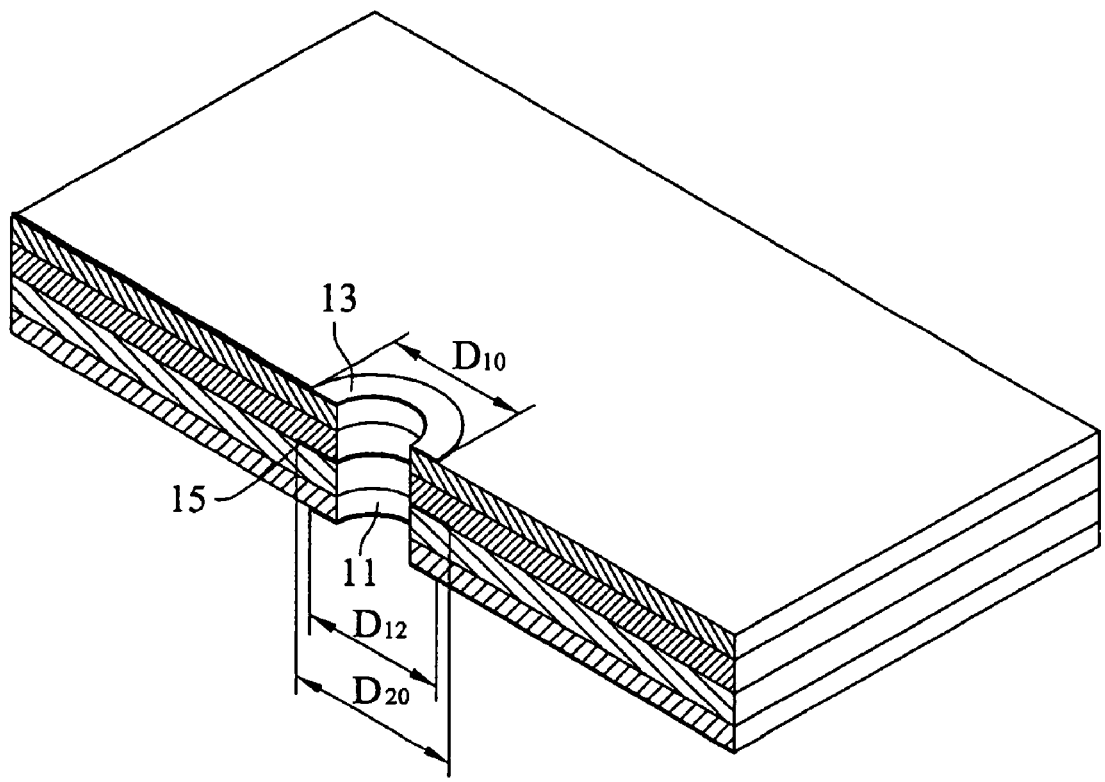
FIG. 1 is a cross section of part of a PCB having a conventional via.
Figure 2:
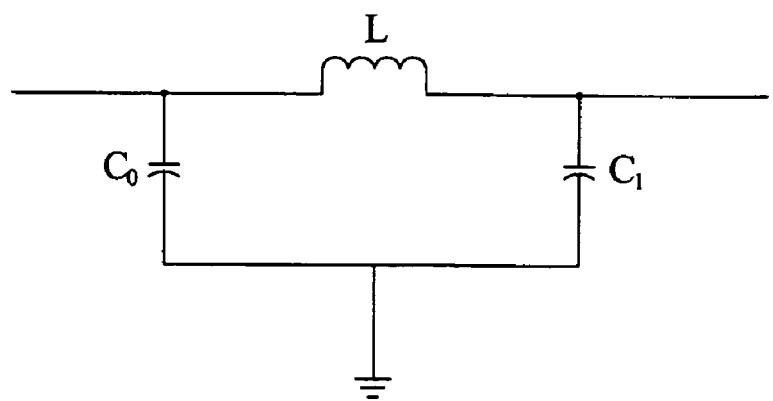
FIG. 2 is a circuit parameter module of a via.
Figure 4:
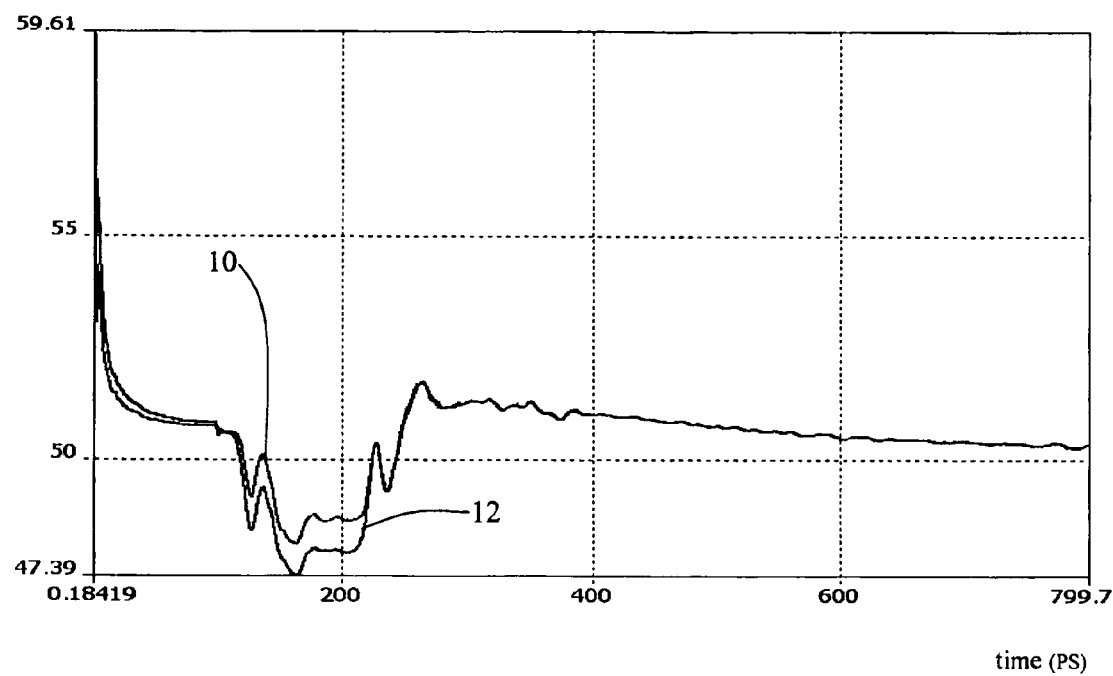
FIG. 4 is a graph of impedance curves of an input signal transmission line when it is transmitted via the PCB of the preferred embodiment of FIG. 3 and via the conventional PCB of FIG. 1 respectively.

Referring to FIG. 4, the impedance curve 10 is a computer emulation of a curve of an input signal transmission line when it is transmitted via the PCB of the preferred embodiment of FIG. 3. The impedance curve 12 is a computer emulation of a curve of the input signal transmission line when it is transmitted via the conventional PCB of FIG. 1. It is shown that, the two curves are quite similar expect when the signals transit the via at which time, the curve 10 is more gentle than the curve 12, that is, the transmission line transmits signals better via the PCB of the embodiment of FIG. 3.

Figure 5:
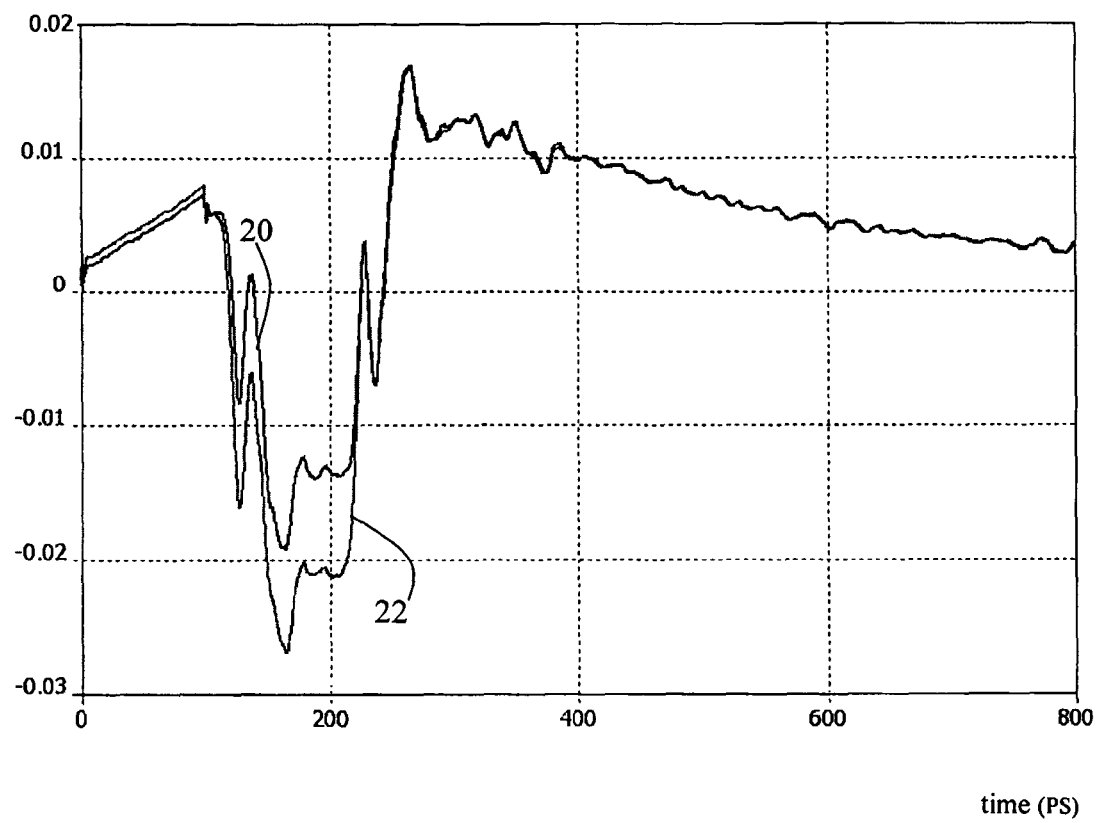
FIG. 5 is a graph of reflection curves of an input signal when it is transmitted via the PCB of the preferred embodiment of FIG. 3 and via the conventional PCB of FIG. 1 respectively.

Referring to FIG. 5, the reflection curve 20 is a computer emulation of a curve of the input signal when it is transmitted via the PCB of the preferred embodiment of FIG. 3. The reflection curve 22 is a computer emulation of a curve of the input signal when it is transmitted via the conventional PCB of FIG. 1. It is shown that, the two curves are quite similar except when the signals transit the via at which time, the reflection of the input signal is smaller when it is transmitted via the PCB of the preferred embodiment of FIG. 3, while the reflection of the output signal is the same in the two cases. And thus is shown that the overall integrity and quality of the transmission characteristics is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A printed circuit board having vias for reducing reflections of input signals, the printed circuit board comprising:
   a first signal layer and a second signal layer;
   a via electrically connecting the first signal layer and the second signal layer, the via having a drill hole, a first pad connected to the first signal layer, a second pad connected to the second signal layer, and an anti-pad located between the first pad and the second pad, wherein an outer diameter of the first pad is smaller than an outer diameter of the second pad, an outer diameter of the anti-pad is greater than the outer diameter of the second pad;
   an input signal line on the first signal layer for transmitting input signals, the input signal line electrically connected with the first pad; and
   an output signal line on the second signal layer for transmitting output signals, the output signal line electrically connected with the second pad.

2. The printed circuit board as claimed in claim 1, wherein the via is a through via.

3. The printed circuit board as claimed in claim 1, wherein the via is a blind via.

4. The printed circuit board as claimed in claim 1, wherein the via is a buried via.

5. A method for improving transmission characteristics of a via of a circuit board, comprising the steps of:
   providing a circuit board having a first signal layer and a second signal layer;
   forming a via in said circuit board, wherein the via comprising a drill hole, a first pad connected to the first signal layer, a second pad connected to the second signal layer, and an anti-pad located between the first pad and the second pad, an outer diameter of the first pad is smaller than an outer diameter of the second pad, an outer diameter of the anti-pad is greater than the outer diameter of the second pad;
   setting an input signal line on said circuit board, wherein the input signal line is electrically connected with the first pad; and
   setting an output signal line independent from the input signal line on the circuit board, wherein the output signal line is electrically connected with the second pad.

6. The printed circuit board as claimed in claim 5, wherein the input signal line is formed on the first signal layer, and the output signal line is formed on the second signal layer.

7. The printed circuit board as claimed in claim 6, wherein the via is a through via.

8. The printed circuit board as claimed in claim 6, wherein the via is a blind via.

9. The printed circuit board as claimed in claim 6, wherein the via is a buried via.

10. A circuit assembly comprising:
    a first signal layer extending in said circuit assembly, and comprising a first signal line extending therein to transmit electrical signals;
    a second signal layer extending in said circuit assembly spaced from said first signal layer, and comprising a second signal line extending therein to transmit said electrical signals; and
    a via definable in said circuit assembly between said first signal layer and said second signal layer, and extending to expose a first end of said via at said first signal layer and a second end of said via at said second signal layer, said via comprising a first pad extendable along said first signal layer around said first end of said via and electrically connectable with said via and said first signal line of said first signal layer respectively for signal communication therebetween, a second pad extendable along said second signal layer around said second end of said via and electrically connectable with said via and said second signal line of said second signal layer respectively for signal communication therebetween, and an anti-pad extendable along a non connective layer between the first and second signal layers around an opening of the via, an extending length of said first pad away from said first end of said via being different from an extending length of said second pad away from said second end of said via, an extending length of said antipad away from the opening of the via is greater than the extending length of said first pad away from said first end of said via and the extending length of said second pad away from said second end of said via.

11. The circuit assembly as claimed in claim 10, wherein said first signal line is used as a signal input line and said second signal line is used as a signal output line, and said extending length of said first pad is smaller than said extending length of said second pad.

* * * * *